(12) United States Patent
Seppala et al.

(10) Patent No.: US 7,800,190 B2
(45) Date of Patent: Sep. 21, 2010

(54) GETTER ON DIE IN AN UPPER SENSE PLATE DESIGNED SYSTEM

(75) Inventors: Bryan Seppala, Mahtomedi, MN (US); Jon DCamp, Morristown, NJ (US); Max Glenn, Morristown, NJ (US)

(73) Assignee: Honeywell International Inc., Morristown, NJ (US)

( * ) Notice: Subject to any disclaimer, the term of this patent is extended or adjusted under 35 U.S.C. 154(b) by 215 days.

(21) Appl. No.: 12/140,006

(22) Filed: Jun. 16, 2008

(65) Prior Publication Data

US 2009/0309203 A1  Dec. 17, 2009

(51) Int. Cl.
*G01L 9/04* (2006.01)

(52) U.S. Cl. .............................. 257/419; 257/E23.137; 257/415; 257/420; 359/291; 359/263

(58) Field of Classification Search .......... 257/E23.137, 257/E23.138, 414–421, 682; 29/592.1; 438/66, 438/68, 72, 107, 118, 126; 359/263, 291, 359/390, 872
See application file for complete search history.

(56) References Cited

U.S. PATENT DOCUMENTS

| | | | | |
|---|---|---|---|---|
| 6,392,144 B1 * | 5/2002 | Filter et al. | ................. | 174/535 |
| 6,624,003 B1 * | 9/2003 | Rice | ........................... | 438/106 |
| 6,635,509 B1 * | 10/2003 | Ouellet | ....................... | 438/106 |
| 6,844,959 B2 * | 1/2005 | Huibers et al. | .............. | 359/297 |
| 6,914,323 B2 | 7/2005 | Curtis et al. | | |
| 7,074,636 B2 | 7/2006 | Curtis et al. | | |
| 7,075,160 B2 * | 7/2006 | Partridge et al. | ............ | 257/414 |
| 7,161,094 B2 * | 1/2007 | Kothari et al. | .............. | 174/539 |
| 7,297,573 B2 | 11/2007 | DCamp et al. | | |
| 7,528,472 B2 * | 5/2009 | Liao et al. | .................... | 257/680 |
| 7,595,209 B1 * | 9/2009 | Monadgemi et al. | .......... | 438/51 |
| 7,611,919 B2 * | 11/2009 | Sand et al. | .................... | 438/51 |
| 2004/0184133 A1 * | 9/2004 | Su et al. | ..................... | 359/290 |
| 2006/0189035 A1 * | 8/2006 | Chen et al. | ................... | 438/118 |
| 2006/0214247 A1 | 9/2006 | DCamp et al. | | |

\* cited by examiner

*Primary Examiner*—Chris Chu
(74) *Attorney, Agent, or Firm*—Fogg & Powers LLC

(57) ABSTRACT

A microelectromechanical system (MEMS) hermetically sealed package device that is less labor intensive to construct and thus less expensive to manufacture. An example package device includes a package having a bottom section and a lid. A MEMS die includes upper and lower plates made in accordance with upper sense plate design. The MEMS die is mounted to the bottom section. The upper and lower plates form a cavity that receives a MEMS device. The upper and lower plates are bonded by one or more bond pads and a seal ring that surrounds the cavity. The seal ring includes grooves that allow exposure of the cavity to the space within the package. A getter material applied to a top surface of the MEMS die on the upper plate. The getter material is activated during or after the lid is mounted to the bottom section.

13 Claims, 4 Drawing Sheets

GETTER ON DIE IN AN UPPER SENSE PLATE DESIGNED SYSTEM

BACKGROUND OF THE INVENTION

Microelectromechanical System (MEMS) devices such as gyroscopes and other devices such as Infrared Radiation (IR) detectors often have a need for a good quality and stable vacuum environment to achieve defined performance levels for extended periods of time (e.g. up to 20 years). To help achieve a stable vacuum, a getter is often placed within the vacuum cavity housing the device. Standard industry getters, such as screened or sintered getters, often generate particles in conditions of High G mechanical shock or excessive mechanical vibration. Such particles can be detrimental to the function of the MEMS or other device housed within the vacuum cavity. In addition, many standard industry getters are provided on a plate or other substrate, which is then welded or otherwise secured to the inside of the device package. This can be a time consuming and tedious process, and in some cases, can reduce the reliability and increase the cost of the resulting product. Thus, there is a need for a low-to-no particle generating getter, and/or a getter that can be more easily provided into a desired vacuum cavity.

SUMMARY OF THE INVENTION

The present invention provides a microelectromechanical system (MEMS) hermetically sealed package device, at various vacuum level, that is less labor intensive to construct and thus less expensive to manufacture.

An example package device includes a package having a bottom section and a lid. A MEMS die includes upper and lower plates made in accordance with upper sense plate design. The MEMS die is mounted to the bottom section. The upper and lower plates form a cavity that receives a MEMS device. The upper and lower plates are bonded by one or more bond pads and a seal ring that surrounds the cavity. The seal ring includes grooves that allow exposure of the cavity to the space within the package. A getter material is applied to a top surface of the MEMS die on the upper plate. The getter material is activated during or after the lid is mounted to the bottom section.

BRIEF DESCRIPTION OF THE DRAWINGS

Preferred and alternative embodiments of the present invention are described in detail below with reference to the following drawings:

FIGS. 3-1 and 3-2 illustrate top x-ray views of an example MEMS package such as that shown in FIG. 1.

DETAILED DESCRIPTION OF THE INVENTION

Figure 1:
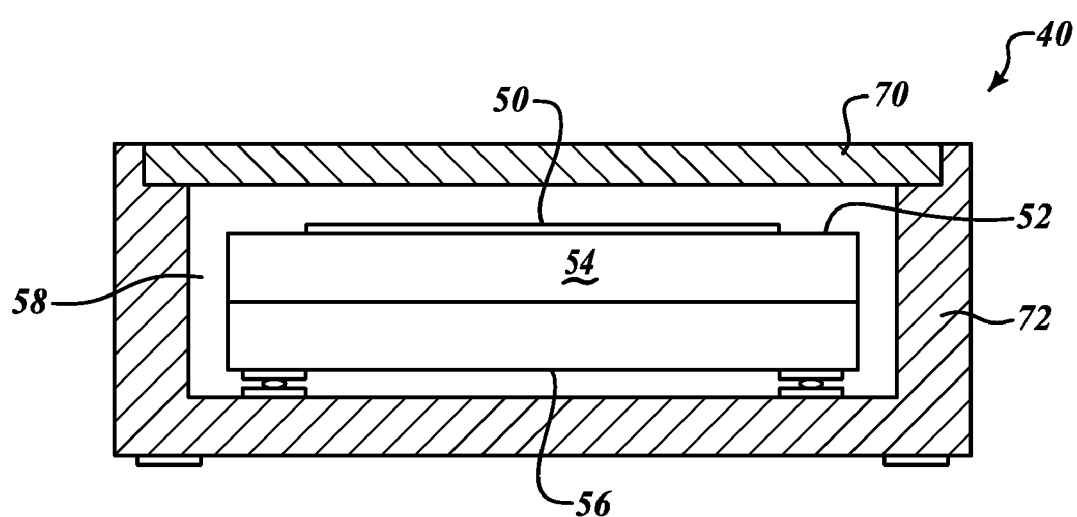
FIG. 1 illustrates a cross-sectional side view of a microelectromechanical system (MEMS) package that includes a MEMS die with a getter deposited on the die in accordance with embodiment of the present invention.

FIG. 1 is a schematic partial cross-sectional side view of a device package 40 with a thin film getter 50 deposited on an upper sense plate designed die 54 having an upper plate 52 and a lower plate 56. The package 40 includes a package housing 72 and a package lid 70 that define a device receiving cavity 58. In the illustrative embodiment, the package 40 is a Leadless Chip Carrier (LCC) package adapted for thermocompression bonding, but it may be any type of package that uses any type of die attach and/or wire bonding, as desired.

In the illustrative embodiment, the package housing 72 includes a number of bond pads, which may be electrically connected to corresponding surface mount pads. The surface mount pads are typically aligned with and adapted to be bonded (e.g. soldered) to corresponding bond pads on a printed circuit board or the like.

The package housing 72 is configured to be thermocompression (or flip-chip) bonded to the die 54, however, other types of die bonding, die configurations and/or bonding techniques may be used. The die 54 is only shown schematically, and may include any type of device that might benefit from a reduced pressure or vacuum environment. For example, the die 54 may include a Microelectromechanical System (MEMS) device such as a gyroscope, an accelerometer, or any other type of MEMS device. In addition, the die 54 may include an IR detection device such as a microbolometer, or any other type of device having at least an upper sense plate design, such as that shown in copending U.S. Patent Application Publication No. 2006/0110854A1, the contents are hereby incorporated by reference. The die 54 includes a number of pads, which are in registration with bond pads of the package housing 72.

The package housing 72 and package lid 70 define a device receiving cavity. During packaging, the device receiving cavity may be exposed to a reduced pressure or vacuum, and the package lid 70 is secured to the package housing 72, leaving a reduced pressure or vacuum environment in the device receiving cavity. In the illustrative embodiment, to help maintain the reduced pressure or vacuum environment in the device receiving cavity over time, a thin film getter 50 is deposited directly on the outside of the die 54. The thin film getter 50 may be patterned using a suitable patterning process. However, masking and etching of the applied thin film getter 50 is not needed because it is directly applied to wafer (e.g., glass, Silicon) that forms part of the die 54.

The thin film getter 50 may be deposited in any number of ways including, for example, sputtering, evaporation such as resistive or e-beam evaporation, vapor deposition, atomic layer deposition, or any other suitable deposition technique. The thin film getter 50 may include any desired chemical composition. In some cases, the thin film getter 50 may be Zirconium (Zr) and may be deposited using sputtering techniques. Zr possesses many chemical characteristics which may make it an attractive selection for the thin film getter 50. In other cases, the thin film getter 50 may be Titanium (Ti), Boron (B), Cobalt (Co), Calcium (Ca), Strontium (Sr), Thorium (Th), combinations thereof, or any other suitable getter element, compounds or material. Generally, the thin film getter 50 may be any desired chemical composition deposited by using any desired deposition technique. In some embodiments, the thin film getter 50 when activated may chemically absorb many or all gases that are anticipated to enter or outgas into the device receiving cavity including, for example, $H_2O$, CO, $CO_2$, $N_2$, $H_2$ and/or other gases, as desired.

In some embodiments, the thin film getter 50 is deposited in a stable form, and does not become active until activated. In some cases, the thin film getter 50 is activated through the application of heat. With respect to the illustrative embodiment of FIG. 1, the thin film getter 50 may be activated during the package sealing process where elevated temperature may be applied.

Figure 2:
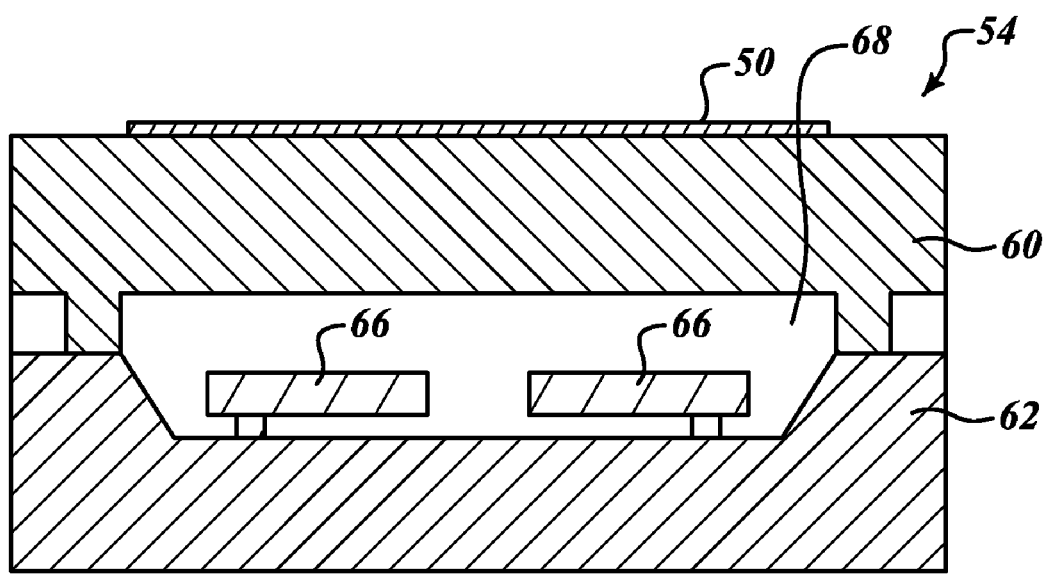
FIG. 2 illustrates an example upper sense plate designed MEMS die that is shown in FIG. 1.

As shown in FIG. 2, the upper sense plate designed die 54 includes top and bottom substrates 60 and 62 that are formed according to upper sense plate design. The top and bottom substrates 60 and 62 are bonded according to known bonding techniques (anodic bonding) to form a device cavity 68. When the substrates 60 and 62 are bonded, small passage way(s) (shown in FIGS. 3-1 and 3-2) remain between the device cavity 68 and the device receiving cavity (58). The passageway(s) allow for vacuum creation during getter activation, but are small enough to keep the device components 66 free of getter material.

The getter 50 may be deposited on top of the top substrate 60 (e.g. glass) during fabrication of the top substrate wafer. In this embodiment, the getter 50 is not patterned and etched. After the substrates 60 and 62 are bonded they are separated (e.g. sawed) singular units. The device cavity 68 includes device components (MEMS device components) 66 with sense plates formed on one or both of the interior surfaces of the substrates 60 and 62.

Figures 1, 3:
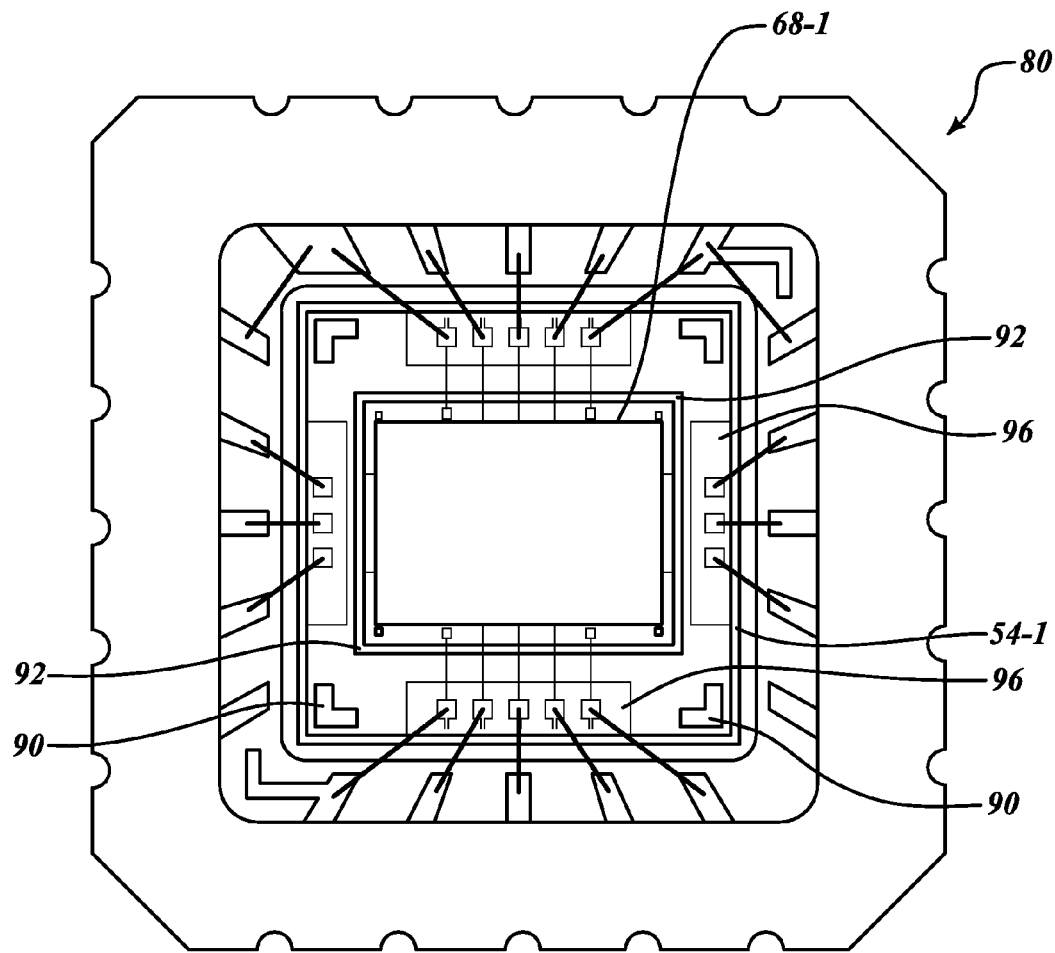
Figures 2, 3:
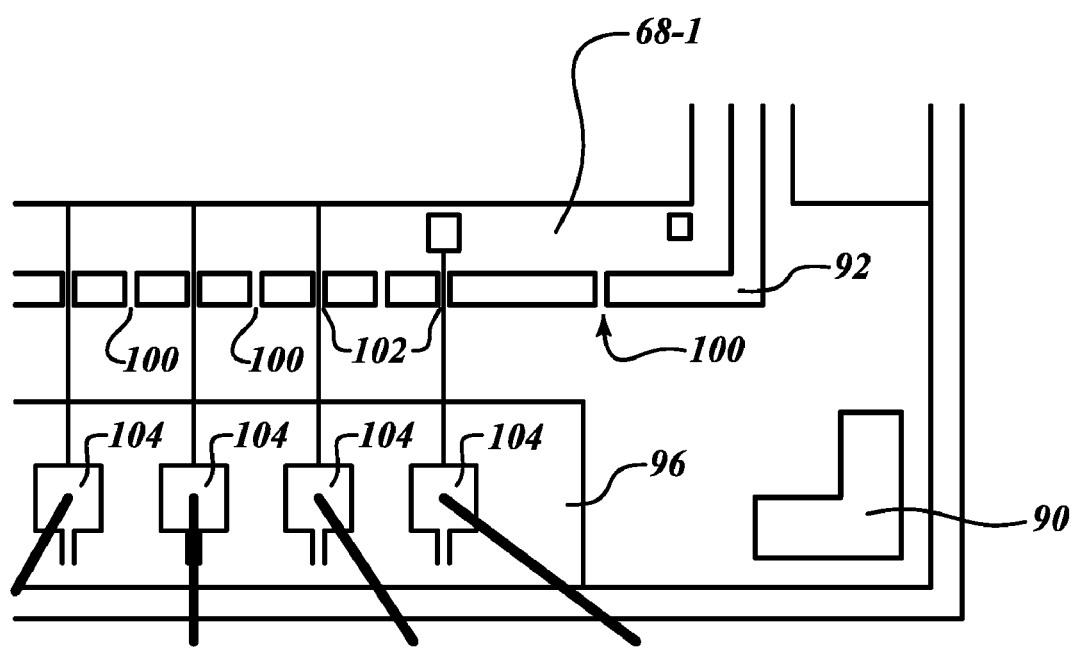

FIGS. 3-1 and 3-2 illustrate top partial x-ray views of a device package 80 that includes a die 54-1 similar to that described above. A top substrate (60) of the die 54-1 is bonded to a bottom substrate (62) at bonding pads 90 and a bonding strip 92 that surrounds a cavity 68-1 within the die 54-1. The bottom substrate includes one or more electrode pad areas 96 on its surface that is bonded to the top substrate. The pad areas 96 along an external edge of the die 54-1 are external to the area defined by the bonding strip 92. The areas 96 may include electrode pads 104 that are electronically connected to components in the cavity 68-1 via leads 102 that pass through the bonding strip 92. Leads connect the electrode pads 104 to electrical traces that pass through the package (70, 72), thus allowing connection to other devices, system, or circuit boards.

The bonding strip 92 and pads 90 are materials for attaching the top and bottom substrates (60, 62) to each other, for example silicon. Void(s) 100 (grooves) are included at various locations in the bonding strip 92. The void(s) 100 allow for pressure in the cavity 68-1 to equal the pressure outside the die 54-1 (i.e., inside the package 70, 72, which is hermetically sealed). The void(s) 100 are sized to keep particles such as dislodged getter from entering the cavity 68-1. For example, the void(s) 100 is about 20-50 μm wide (x direction), 50-200 μm long (y direction) and 0.5-10 μm high (z direction).

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A microelectromechanical system (MEMS) hermetically sealed package device at various vacuum levels, the system comprising:
   a package comprising a bottom section and a lid;
   a MEMS die having upper and lower plates configured in accordance with upper sense plate design, the die being mounted to the bottom section, wherein the upper and lower plates form a cavity configured to receive a MEMS device, the upper and lower plates are bonded by one or more bond pads and a seal ring that surrounds the cavity, the seal ring includes two or more grooves configured to allow exposure of the cavity to the space within the package; and
   a getter material applied to a top surface of the MEMS die on the upper plate.

2. The device of claim 1, wherein the upper plate is formed from a wafer, the getter material being applied at a wafer construction stage.

3. The device of claim 1, wherein the getter material is applied after the upper plate is mounted to the lower plate.

4. The device of claim 1, wherein the getter material is activated at the time the lid is attached to the bottom section of the package.

5. A hermetically sealed package device comprising:
   a package including a bottom section and a lid that define a device receiving cavity;
   a die having upper and lower plates configured in accordance with upper sense plate design, the die being mounted to the bottom section, wherein the upper and lower plates form a device cavity configured to receive at least one device component, wherein the upper and lower plates are bonded by one or more bond pads and a bonding strip that surrounds the device cavity, wherein the bonding strip includes two or more grooves configured to allow exposure of the device cavity to the device receiving cavity within the package; and
   a getter material applied to a top surface of the die on the upper plate, wherein the two or more grooves in the bonding strip are sized to allow for vacuum creation during an activation of the getter material and to prevent particles from entering the device cavity.

6. The device of claim 5, wherein the upper plate is formed from a wafer, the getter material being applied at a wafer construction stage.

7. The device of claim 5, wherein the getter material is applied after the upper plate is mounted to the lower plate.

8. The device of claim 5, wherein the getter material is activated at the time the lid is attached to the bottom section of the package.

9. The device of claim 8, wherein the getter material, when activated, chemically absorbs gases that enter the cavity.

10. The device of claim 5, wherein the getter material, when activated, chemically absorbs gases that enter the cavity.

11. The device of claim 5, wherein the two or more grooves in the bonding strip allow a pressure in the device cavity to equal a pressure in the device receiving cavity.

12. The device of claim 5, wherein the getter material includes one or more of Titanium, Boron, Cobalt, Calcium, Strontium, and Thorium.

13. A microelectromechanical system (MEMS) hermetically sealed package device at various vacuum levels, the system comprising:
   a package comprising a bottom section and a lid that define a device receiving cavity;
   a MEMS die having an upper plate and a lower plate, the upper plate and the lower plate being configured in accordance with upper sense plate design, the MEMS die being mounted to the bottom section, wherein the upper plate and the lower plate form a device cavity configured to receive at least one MEMS device, wherein the upper and lower plates are bonded by one or more bond pads and a seal ring that surrounds the device cavity, wherein the seal ring includes two or more grooves configured to allow exposure of the device cavity to the device receiving cavity within the package; and
   a getter material applied to a top surface of the MEMS die on the upper plate, wherein the upper plate is formed from a wafer, and the getter material is applied at a construction stage of the wafer, wherein the getter material is activated at the time the lid is attached to the bottom section of the package, and wherein the two or more grooves in the seal ring are sized to allow for vacuum creation during an activation of the getter material and to prevent particles from entering the device cavity.

* * * * *